US009411235B2

(12) United States Patent
Kaneko

(10) Patent No.: US 9,411,235 B2
(45) Date of Patent: Aug. 9, 2016

(54) COATING AND DEVELOPING APPARATUS, METHOD OF OPERATING THE SAME AND STORAGE MEDIUM

(71) Applicant: TOKYO ELECTRON LIMITED, Tokyo (JP)

(72) Inventor: Tomohiro Kaneko, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 148 days.

(21) Appl. No.: 14/488,737

(22) Filed: Sep. 17, 2014

(65) Prior Publication Data

US 2015/0077727 A1 Mar. 19, 2015

(30) Foreign Application Priority Data

Sep. 19, 2013 (JP) ................................ 2013-194145

(51) Int. Cl.
*G03D 5/00* (2006.01)
*G03F 7/20* (2006.01)
*G03F 7/30* (2006.01)

(52) U.S. Cl.
CPC ............ *G03F 7/2035* (2013.01); *G03F 7/3042* (2013.01)

(58) Field of Classification Search
USPC .......................................................... 396/611
See application file for complete search history.

(56) References Cited

U.S. PATENT DOCUMENTS 6,834,210 B2 * 12/2004 Tateyama .......... H01L 21/67276 700/100
7,210,864 B2 * 5/2007 Higashi ............... H01L 21/6715 355/27
2005/0046934 A1 3/2005 Ho et al.
2006/0161286 A1 * 7/2006 Kobayashi ............. G06Q 10/04 700/112
2006/0287200 A1 * 12/2006 Kaneko ............... G03F 7/70533 505/126
2008/0117390 A1 * 5/2008 Kaneko ................. G03F 7/7075 355/27

FOREIGN PATENT DOCUMENTS

JP 4584926 B2 11/2010
JP 2010-287686 12/2010
JP 2012-199318 A1 10/2012

* cited by examiner

*Primary Examiner* — Rodney Fuller
(74) *Attorney, Agent, or Firm* — Burr & Brown, PLLC

(57) ABSTRACT

A coating and developing apparatus includes: first and second transfer mechanisms for transferring a substrate from a first mount module to a second mount module, one of the first and second transfer mechanisms being selected each time when the substrate transfer should be performed; first and second processing modules for performing substrate processing, for which the transfer of substrates is performed by the first and second transfer mechanisms, respectively; and a control unit. The control unit controls the transfer mechanisms for the substrate transfer by determining a delay time, representing a delay caused by the transfer of the substrate to the second mount module to the timing of transfer of a substrate from the first/second processing module, in regard to each of the first and second transfer mechanisms and selecting one of the first and second transfer mechanisms whose delay time is the shortest.

9 Claims, 15 Drawing Sheets

TRANSFER ROUTE

| STEP | 1 | 2 | 3 | 4 | 5 | 6 | 7 | 8 | 9 | 10 | 11 | 12 |
|---|---|---|---|---|---|---|---|---|---|---|---|---|
| MODULE | START | TRS | ADH | SCPL | COT | PAB | TRS | SCPL | ITC | PAB | TRS | SBU |
| TRANSFER ARM FOR LOADING | – | 13 | 14 | 14 | F1 | F1 | F1 | ARM GROUP | F2 | F2 | F2 | 22 |
| TRANSFER ARM FOR UNLOADING | 13 | 14 | 14 | F1 | F1 | F1 | ARM GROUP | F2 | F2 | F2 | 21 | 22 |

EXPOSURE APPARATUS

| 13 | 14 | 15 | 16 | 17 | 18 | 19 | 20 | 21 | 22 | 23 | 24 |
|---|---|---|---|---|---|---|---|---|---|---|---|
| BST | ICPL | | TRS | PIR | TRS | PEB | SCPL | DEV | TRS | TRS | End |
| 22 | 22 | 22 | 23 | 21 | 21 | F3 | F3 | F3 | F3 | 14 | 13 |
| 22 | 22 | 23 | 23 | 21 | F3 | F3 | F3 | F3 | 14 | 13 | – |

FIG. 5

TRANSFER SCHEDULE (FOR REMOVING WAFER FROM CARRIER)

| STEP | 2 | 3~4 | 5~7 | 8 | 9~11 | 12~14 | 15~16 | 17~18 | 19~22 | 23 | 24 |
|---|---|---|---|---|---|---|---|---|---|---|---|
| MODULE | TRS1 | | | | | | | | | | |
| TRANSFER ARM FOR LOADING | 13 | 14 | F1 | ARM GROUP | F2 | 22 | 23 | 21 | F3 | 14 | 13 |
| WAFER | A1 | A1 | A1 | A1 | A1 | A1 | A1 | A1 | A1 | A1 | A1 |

FIG. 7

COATING AND DEVELOPING APPARATUS, METHOD OF OPERATING THE SAME AND STORAGE MEDIUM

CROSS-REFERENCE TO RELATED APPLICATIONS

This application is based upon and claims the benefit of priority from Japanese patent application No. 2013-194145 filed on Sep. 19, 2013, the entire contents of which are incorporated herein by reference.

BACKGROUND OF THE INVENTION

1. Field of the Invention

The present invention relates to a coating and developing apparatus including processing modules, a method for operating the coating and developing apparatus, and a storage medium storing a computer program to be used for a coating and developing apparatus.

2. Background Art

A coating and developing apparatus coats a semiconductor wafer as a substrate (hereinafter referred to as a "wafer") with a resist and develops the resist after exposure. The coating and developing apparatus is provided with many modules and a plurality of transfer arms for transferring the wafers among the modules. Herein, any place or location where a wafer is placed may be interpreted as "module".

After a carrier storing wafers has been transferred to the coating and developing apparatus, a transfer schedule is set for all wafers in the carrier (which will undergo the same type of process steps) before the wafers are removed from the carrier. The transfer schedule is a schedule specifying modules to which each wafer should be transferred after being removed from the carrier and before returning to the carrier. Since the modules to which each wafer should be transferred have previously been determined as above, transfer arms (for transferring each wafer among the modules) that should be used have also been previously determined before each wafer is removed from the carrier.

The coating and developing apparatus will be explained more concretely below. The coating and developing apparatus is equipped with a processing block which includes resist coating modules for performing the resist coating process and developing modules for performing the developing process, and an interface block which transfers the wafers between an exposure apparatus and the processing block. The interface block includes processing modules for cleaning each wafer before exposure and processing modules for cleaning each wafer after exposure, which is described in JP2010-287686A and JP458492682). As shown in 3P2012-199318A, the interface block may include many transition modules, stacked up, to transfer the wafers among the processing modules, parts of the processing block, and the exposure apparatus. In this case, a plurality of transfer arms share the transfer work to and from the many transition modules.

However, there may be a difference (deviation) in the number of transfer processes (i.e., the number of times of transfer executions) among the transfer arms depending on the aforementioned transfer schedule. For example, the first transfer arm performs the inter-module transfer five times, while the second transfer arm performing the inter-module transfer three times. With such a deviation in the number of transfer processes among the transfer arms, the productivity of the apparatus can be limited by the operation of the transfer arm whose number of transfer processes is the greatest. Further, in order to increase the productivity of the apparatus, the processed wafer should be unloaded from each processing module to allow a subsequent unprocessed wafer to be loaded into the processing module immediately after the completion of the processing in the processing module, so that processing modules can be used efficiently

SUMMARY OF THE INVENTION

The object of the present invention is to provide a technique with which the productivity of coating and developing apparatus can be increased.

In one embodiment of the present invention, there is provided a coating and developing apparatus that forms, in a processing block, a coating film including a resist film on a substrate removed from a carrier loaded into a carrier block, and performs, in the processing block, a developing process to the substrate having been exposed by an exposure apparatus connected to an interface block. The coating and developing apparatus includes: a first mount module on which the substrate is placed; a second mount module on which the substrate transferred from the first mount module is placed; first and second transfer mechanisms each of which is provided to transfer the substrate from the first mount module to the second mount module, wherein one of the first and second transfer mechanisms is selected each time when the substrate is to be transferred from the first mount module to the second mount module; first and second processing modules which are each configured to process the substrate, wherein the first transfer mechanism and the second transfer mechanism are assigned to transfer the substrate to the first processing module and the second processing module, respectively; and a control unit that selects one transfer mechanism, which is to be used for transferring the substrate from the first mount module to the second mount module, from the first and second transfer mechanisms and outputs a control signal that instructs the selected transfer mechanism to transfer the substrate; wherein the control unit is configured to determine a first delay time in removing the substrate from the first processing module by the first transfer mechanism which first delay time is caused due to transferring of the substrate to the second mount module by the first transfer mechanism, and also determine a second delay time in removing the substrate from the second processing module by the second transfer mechanism which second delay time is caused due to transferring of the substrate to the second mount module by the second transfer mechanism, and configured to select the first transfer mechanism as said one transfer mechanism if the first delay is shorter than the second delay, or the second transfer mechanism as said one transfer mechanism if the second delay is shorter than the first delay.

According to the foregoing embodiment, the transfer mechanism to be used for the transfer of a substrate (e.g., wafer) is determined based on the transfer status of substrates, by which continuous use of one of the first and second transfer mechanisms for the transfer to the second mount module is prevented. Therefore, the deviation in the number of transfer processes among the transfer arms is suppressed. Further, retention time of each substrate that has already become transferable (ready to be unloaded) can be reduced In the first and second processing modules. Consequently, the productivity of the coating and developing apparatus can be increased.

BRIEF DESCRIPTION OF THE DRAWINGS

FIG. 5 is a table showing a transfer route that is set to the coating and developing apparatus.

FIG. 7 is a table showing a transfer schedule being created.

DESCRIPTION OF EMBODIMENTS

Figure 1:
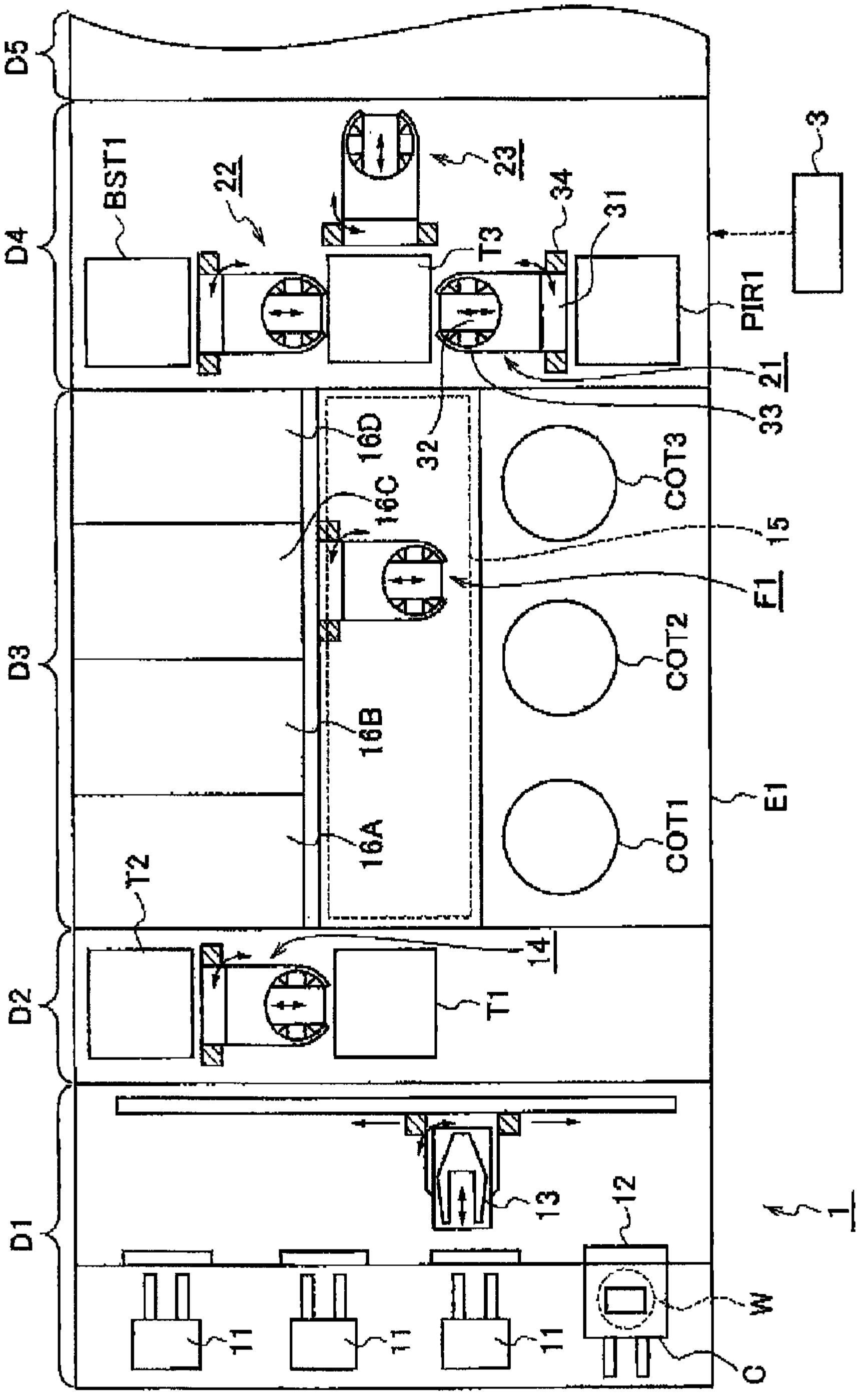
FIG. 1 is a plan view of a coating and developing apparatus in accordance with an embodiment of the present invention.
Figure 2:
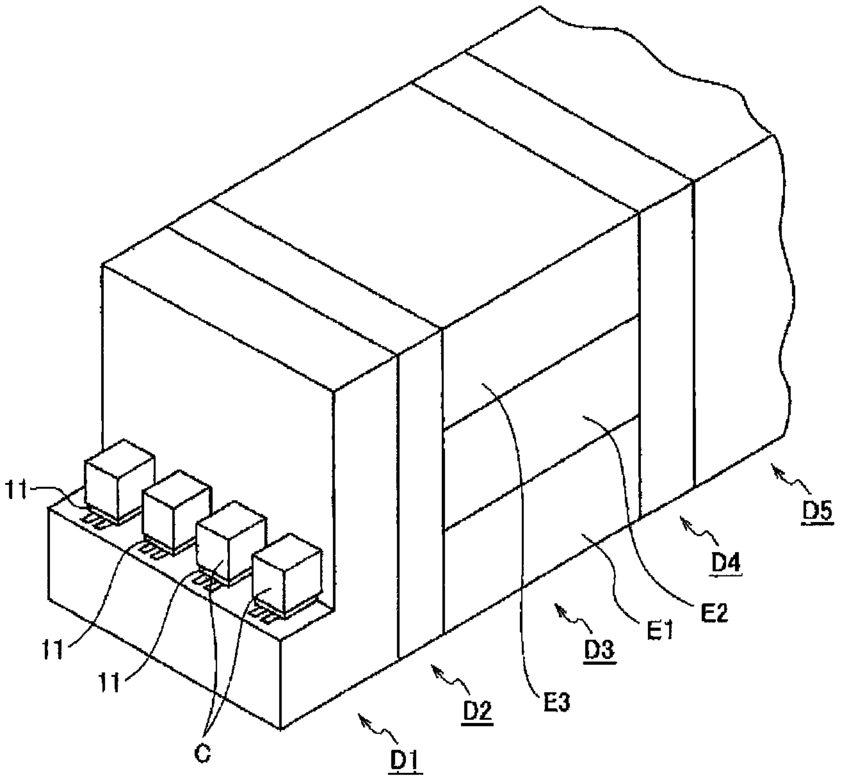
FIG. 2 is a perspective view of the coating and developing apparatus.
Figure 3:
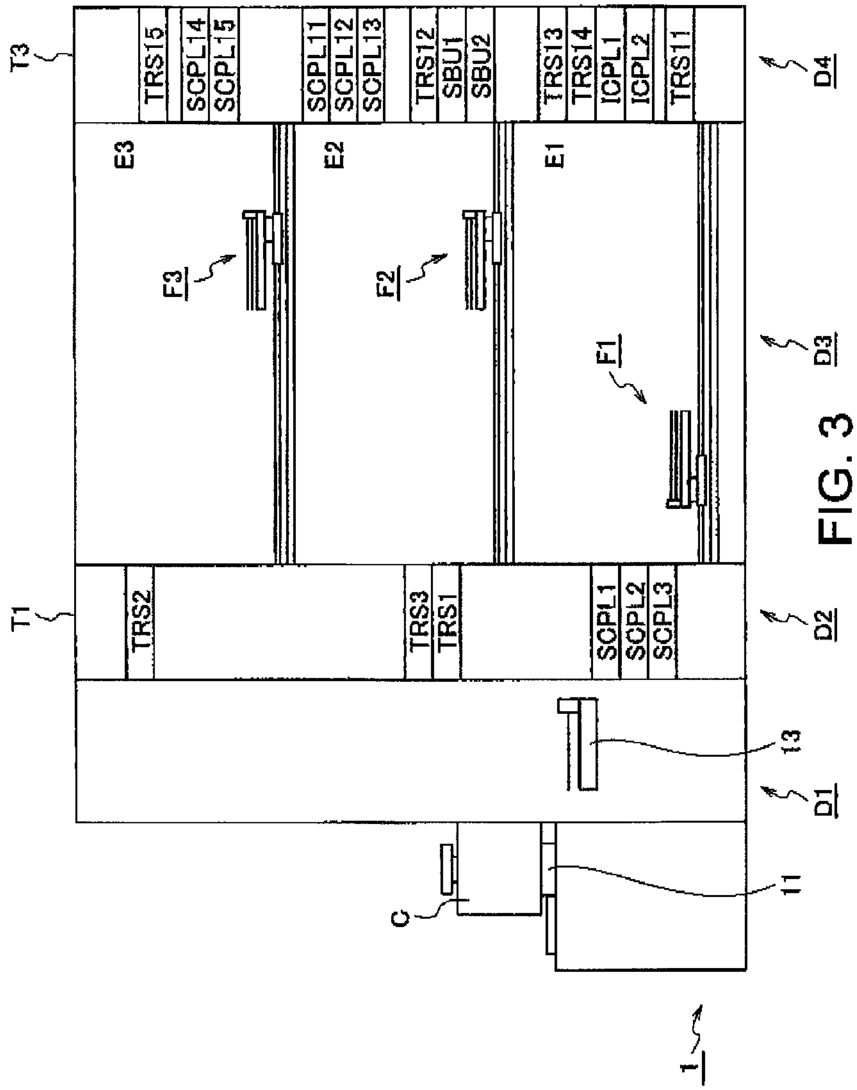
FIG. 3 is a schematic vertical sectional side view of the coating and developing apparatus.

A coating and developing apparatus 1 in one embodiment of the present invention will be described below with reference to FIGS. 1 to 3. FIG. 1 is a plan view, FIG. 2 is a perspective view and FIG. 3 is a schematic vertical sectional side view of the coating and developing apparatus 1. The coating and developing apparatus 1 is composed by linearly connecting a carrier block D1, a multipurpose block D2, a processing block D3 and an interface block D4. An exposure apparatus D5 is connected to the interface block D4. In the following explanation, the direction of the arrangement of the blocks D1 to D4 will be referred to as "left-right direction", and a horizontal direction orthogonal to the left-right direction will be referred to as " front-back direction".

The carrier block D1 functions as a block for loading and unloading each carrier C (storing a plurality of wafers W, i.e., substrates) to and from the coating and developing apparatus 1 and for carrying each carrier C out of the coating and developing apparatus 1. The carrier block D1 includes carrier mount tables 11, open/close parts 12, and a transfer arm 13 for transferring each wafer W from a carrier C through each open/close part 12.

The multipurpose block D2 includes a tower T1, a transfer arm 14 and a tower T2, which are arranged in this order in the front-back direction. The tower T1 is arranged in the central part of the multipurpose block D2 in regard to the front-back direction. The tower T1 includes mount modules SCPL1, SCPL2 and SCPL3, and TRS1, TRS2 and TRS3, which are stacked up. Each mount module referred to as SCPL or ICPL (explained later) is configured such that cooling water can be supplied to a stage for placing a wafer W thereon, so as to control the temperature of the wafer W. The wafers W can be transferred between the carrier block D1 and the processing block D3 through the mount modules SCPL and TRS in the tower T1. The tower 12 includes hydrophobizing modules ADH1, ADH2, ADH3, and ADH4 which are stacked up. Each of the hydrophobizing modules ADH1-ADH4 performs a hydrophobization process to the surface of a wafer W. The transfer arm 14 is capable of transferring the wafers W between the modules of the tower T1 and the modules of the tower T2. It should be note that, in the specification, if it is not necessary to distinguish or identify the individual modules or the individual blocks of the same type from each other, the module(s) or block(s) may be designated by only the alphabet part (e.g., "ADH") of the reference sign (e.g., "ADH3") indicating the type of the module(s) or block(s) while deleting the ID digit (number) part (e.g., "3") of the reference sign.

The processing block D3 in this embodiment is formed by stacking up first, second and third unit blocks E1, E2 and E3 from the bottom. Each of the unit blocks E1-E3 performs a liquid treatment to a wafer W. The first unit block E1 is a block that performs processes for farming a resist film. The second unit block E2 is a block that performs processes for forming a protective film on the resist film. The third unit block E3 is a block for forming a resist pattern in the resist film by developing the resist film having been exposed by the exposure apparatus D5.

The first unit block E1 shown in FIG. 1 will be explained below as a representative of the unit blocks. Along a linear transfer region 15 extending from the multipurpose block D2 to the interface block D4, shelf units 16A, 16B, 16C and 16D are arranged in the left-right direction. Each shelf unit is configured to allow therein a plurality of modules to be stacked up. In this embodiment, heating modules PAB1, PAB2, PAB3, PAB4 and PAB5 each for performing a heating process to a wafer W are included in the shelf units 16A-16D. Resist coating modules COT1, COT2 and COT3 as liquid treatment modules are arranged to face the shelf units 16A to 16D across the transfer region 15. Each of the resist coating modules COT1-COT3 supplies a resist solution to a wafer W and thereby forms the resist film. In regard to the front-back direction, the side with the shelf units 16A-16D will be referred to as a "rear side", and the side with the resist coating modules COT1-COT3 (liquid treatment modules) will be referred to as a "front side", in the following explanation.

A transfer arm F1 is arranged in the transfer region 15. The transfer arm F1 is capable of transferring the wafers W among the heating modules PAB1-PAB5, the resist coating modules COT1-COT3, and mount modules in the tower T1 and a tower T3 (explained later) that are situated at the same height as the first unit block E1.

The second unit block E2 is configured similarly to the first unit block E1 except that protective film formation modules ITC1, ITC2 and ITC3 are disposed therein as the liquid treatment modules instead of the resist coating modules COT1-COT3. A transfer arm F2 shown in FIG. 3 is an equivalent to the transfer arm F1. Heating modules arranged in the second unit block E2 may be referred to as heating modules PAB11, PAB12, PAB13, PAB14 and PAB15.

The third unit block E3 is configured similarly to the first unit block E1 except that developing modules DEV1, DEV2, DEV3 and DEV4 are disposed therein as the liquid treatment modules instead of the resist coating modules COT1-COT3. A transfer arm F3 shown in FIG. 3 is an equivalent to the transfer arm F1. Heating modules arranged in the third unit block E3 may be referred to as heating modules PAB1, PAB2, PAB3, PAB4 and PAB5. Each of the transfer arms F1 to F3 also serve as a transferring mechanism for transferring a wafer W to and from the interface block D4, and to and from the multipurpose block D2.

Figure 4:
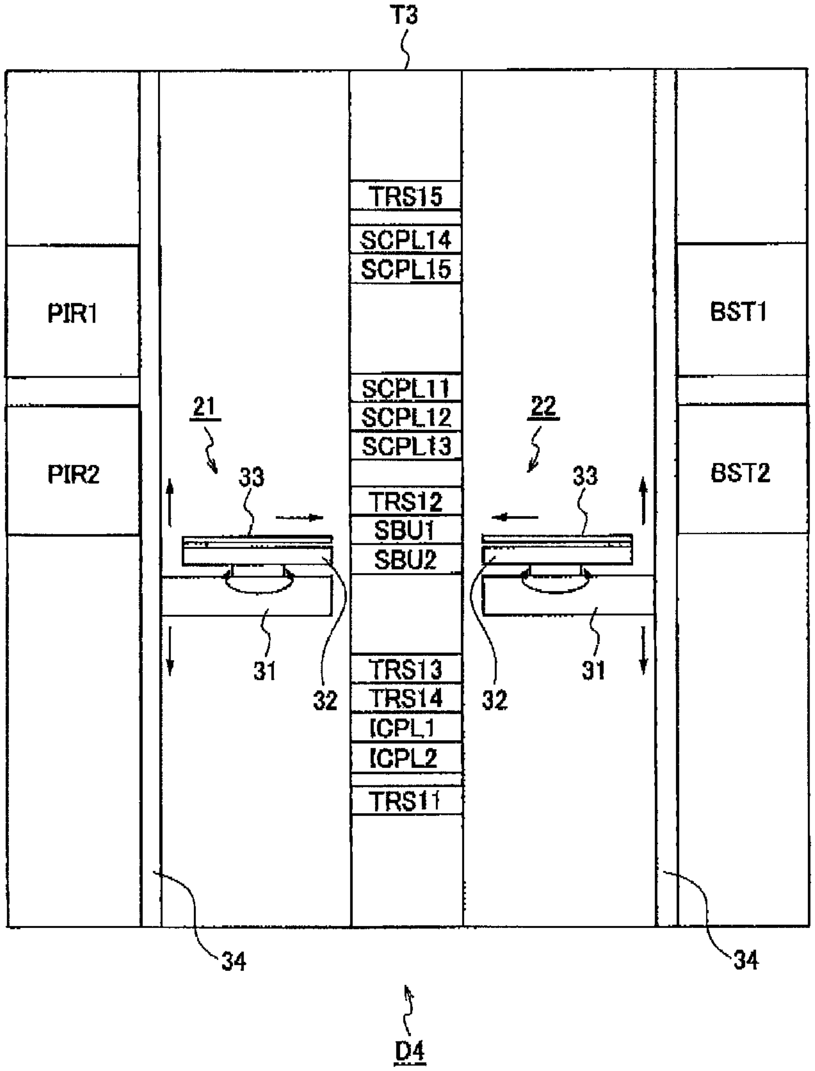
FIG. 4 is side view of an interface block of the coating and developing apparatus.

Next, the interface block D4 will be explained below with reference to its side view shown in FIG. 4. The interface block D4 includes the tower T3 disposed in the central part of the block D4 in regard to the front-back direction. The tower T3 includes mount modules TRS11, TRS12, TRS13, TRS14 and TRS15; SBU1 and SBU2; ICPL1 and ICPL2; and SCPL11, SCPL12, SCPL13, SCPL14 and SCPL15, which are stacked up. In each mount module referred to as SBU, a plurality of wafers W can be placed therein. On the rear side of the tower T3, back side cleaning modules BST1 and BST2 are stacked up to form a first stack. Each back side cleaning module BST cleans the back side of a wafer W before exposure using a brush. On the front side of the tower T3, post exposure cleaning modules PIR1 and PIR2 are stacked up to form a second stack. Each post exposure cleaning module PIR supplies a cleaning liquid to the front side of a wafer W after exposure and thereby performs a S cleaning process and removal of the protective film.

The interface block D4 is equipped with a first transfer arm 21 and a second transfer arm 22. Each of the transfer arms 21 and 22 includes an elevator part 31, a turntable 32 that is rotatable on the elevator part 31 around a vertical axis, and a wafer holding part 33 that can move forward and backward on the turntable 32. The reference sign 34 in FIG. 4 designates a guide for the elevator part 31. The first transfer arm 21 is arranged between the second stack (including the post exposure cleaning modules PIR1 and PIR2) and the tower T3 (including the stack of mount modules) to transfer the wafers W among these modules. The second transfer arm 22 is arranged between the first stack (including the back side cleaning modules BST1 and BST2) and the tower T3 (including the stack of mount modules) to transfer the wafers W among these modules. That is, the interface block D4 has a layout that allows both the first and second transfer arms 21 and 22 to access each mount module constituting the tower T3, allows only the first transfer arm 21 to access the post exposure cleaning modules PIR1 and PIR2, and allows only the second transfer arm 22 to access the back side cleaning modules BST1 and BST2.

The interface block D4 is further equipped with a third transfer arm 23, The third transfer arm 23 is arranged on the exposure apparatus D5 side of the tower T3, for example. The third transfer arm 23 has the same configuration as the first and second transfer arms 21 and 22. The third transfer arm 23 is capable of transferring the wafers W to and from the exposure apparatus D5 and the mount modules ICPL1, ICPL2, TRS13 and TRS14 installed in the tower T3.

The coating and developing apparatus 1 is equipped with a control unit 3. The control unit 3 is a computer comprising a data processing unit including a CPU (Central Processing Unit), a memory and a program. As will be explained later, the program sets a transfer schedule defining transfer paths among modules based on a transfer route for transferring the wafers W and controls the operation of the transfer arms by sending control signals to the transfer arms so that each wafer W is transferred according to the transfer schedule. Further, the program determines a transfer arm to be used for transferring each wafer W according to a flow explained later, and also controls the operation of the modules for processing the wafers W. The program is stored in a non-transitory storage medium (flexible disk, compact disc, hard disk, MO (magneto-optical disk), memory card, etc.) and installed in the control unit 3.

FIG. 5 is a table showing a transfer route of the wafers W in the foregoing coating and developing apparatus 1. The transfer route is data specifying STEPs (STEP number) indicating the transferring order in the coating and developing apparatus 1, the type of the module associated with each STEP, the transfer arm to be used for loading the wafer W into the module associated with each STEP, and the transfer arm to be used for unloading the wafer W from of the module associated with each STEP. The transfer route is previously stored in the control unit 3 before the start of the transfer of the wafers W.

A plurality of modules meeting the following requirement are referred to as "multiple module set": the transfer sequence number (equivalent to the "STEP number") of the plurality of modules from the starting of the transfer from carrier C are identical to each other; and the process/treatment which the plurality of modules performs to the wafer are identical to each other. A plurality of mount modules, each which does not perform a process/treatment but just allows a wafer to be placed thereon/therein, are also constitute a multiple module set. For example, the back side cleaning modules BST1 and BST2 constitute a multiple module set. Likewise, the mount modules SCPL1 to SCPL3 constitute a multiple module set. A wafer W is transferred to one of the modules constituting a multiple module set. The "transfer route" does not identify a specific module, included in a multiple module set, to which each wafer W is transferred. The "transfer schedule" specifies a transfer destination module, and thus specifies a module, included in a multiple module set, to which each wafer W is transferred.

In the transfer route shown in FIG. 5, the transfer arms used for the transfer from the mount module TRS to the mount modules SCPL in the steps 7 and 8 are referred to as an "arm group". This arm group is formed by the aforementioned first and second transfer arms 21 and 22. This transfer route (data) specifies that the transfer from the mount module TRS to the mount modules SCPL should be carried out by either one of the transfer arms 21 and 22. A procedure for determining the transfer arm in the arm group to be used will be explained in detail later.

Figure 6:
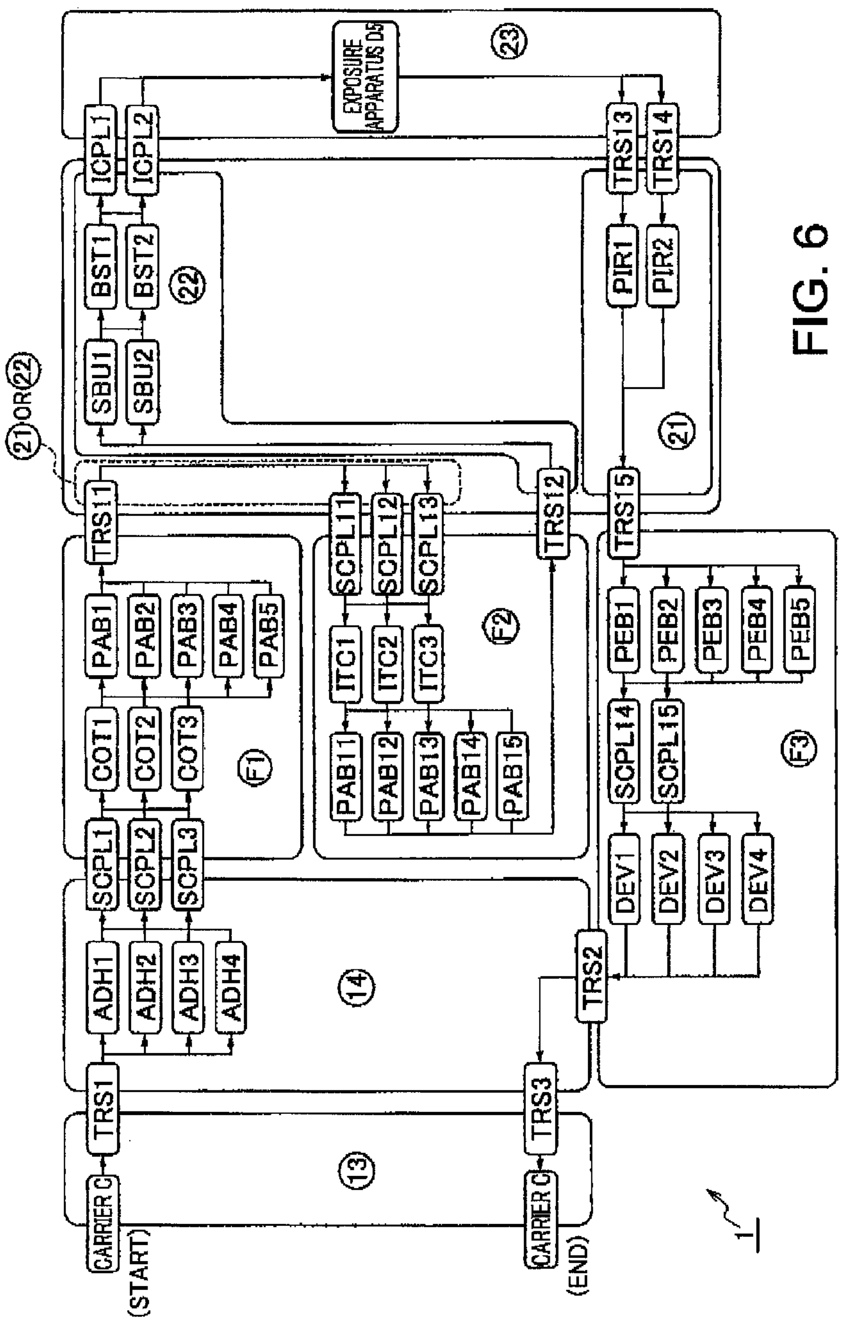
FIG. 6 is a path diagram schematically showing a flow of a wafer according to the transfer route.

The control unit 3 is configured to recognize the presence/absence of a wafer W in each module based on a signal transmitted from the module, and configured to predict the time (length of time) from the present time point to the time point when the wafer W in each module becomes transferable (removable) therefrom. The control unit 3 is also capable of recognizing the transfer performance status of each transfer arm. In detail, the control unit 3 is capable of recognizing whether each transfer arm is transferring a wafer W, or is in a standby state (idle state) not transferring a wafer W. Further, the control unit 3 is configured to acquire the travel distance of each transfer arm (from its current position to a particular module) and an estimated travel time, FIG. 6 is a path diagram schematically showing a wafer transfer flow in the coating and developing apparatus 1 witch is performed according to the aforementioned transfer route. Each box surrounding modules indicates that the transfer arm(s) corresponding to the box is used for the surrounded modules.

This transfer flow will be explained below. After a carrier C staring wafers W is set on the mount table 11, each wafer W is transferred in the order of the transfer arm 13→the mount module TRS1 of the tower T1→the transfer arm 14→one of the hydrophobizing modules ADH1-ADH4 in which the wafer is subjected to the hydrophobizing process.

The wafer W having been subjected to the hydrophobizing process is transferred in the following order; one of the mount modules SCPL1-SCPL3 of the tower T1→the transfer arm F1→one of the resist coating modules COT1-COT3 in which the resist film is formed on the wafer W. Thereafter, the wafer W is transferred in the following order: the transfer arm F1→one of the heating modules PAB1-PAB5→the mount module TRS11 of the tower T3→the first transfer arm 21 or the second transfer arm 22→one of the mount modules SCPL11-SCPL13→the transfer arm F2→one of the protective film formation modules ITC1-ITC3 in which the protective film is formed on the resist film.

The wafer W having the protective film formed on the resist film is transferred in the following order: the transfer arm F2→one of the heating modules PAB11-PAB15→the transfer arm F2→the mount module TRS12 of the tower T3→the second transfer arm 22→one of the mount modules SBU1-SBU2→the second transfer arm 2→one of the back side cleaning modules BST1-BST2 in which the wafer is subjected to the back side cleaning process. Thereafter, the wafer W is transferred in the following order: the second transfer arm 22→one of the mount modules ICPL1-ICPL2 of the tower T3→the third transfer arm 23→the exposure apparatus D5 in which the resist film is exposed in a prescribed pattern.

The wafer W having been exposed is transferred in the following order: the third transfer arm 23→one of the mount modules TRS13-TRS14 of the tower T3→the second transfer arm 22→one of the post exposure cleaning modules PIR1-PIR2 in which the wafer W is subjected to the post exposure cleaning process. The wafer W having been subjected to the post exposure cleaning process is transferred in the following order: the first transfer arm 21→the mount module TRS15 of the tower T3→the transfer arm F3→one of the heating modules PEB1-PEB5→the transfer arm F3→one of the mount modules SCPL14-SCPL15 of the tower T3→the transfer arm F3→one of the developing modules DEV1-DEV4 in which the wafer is subjected to the developing process. The wafer W having been subjected to the developing process is transferred in the following order: the transfer arm F3→the mount module TRS2 of the tower T1→the transfer arm 14→the mount module TRS3 of the tower T1→the transfer arm 13→the carrier C. The wafers W stored in the carrier C are removed from the carrier C and are transferred one by one in the foregoing order, in such a manner that a wafer removed from the carrier C later does not overtake a wafer removed from the carrier C earlier.

In this coating and developing apparatus 1, the control unit 3 sets for each wafer W the transfer schedule specifying the transfer destination of the wafer just before the wafer W is removed from the carrier C. Thus, the timing of setting the transfer schedule of each wafer W differs from wafer to wafer. The transfer schedule which is set at this stage only specifies blocks that the wafer W should pass through and a module to which the wafer W should be transferred at first after leaving the carrier C (i.e., the mount module TRS1).

FIG. 7 is a table showing an example of the transfer schedule that has been set as mentioned above, In the transfer schedule shown in FIG. 7, the reference sign “A1” means the “1”st (first) wafer W to be subjected to a type-“A1” process. In the following explanation, the wafers W may be identified by a sign like “A1”, the combination of a process type indicative alphabet and a number. Although the wafer A1 has been determined to be transferred to the mount module TRS1 in the step 2 as explained above, modules to which the wafer A1 should be transferred in the step 3 and the subsequent steps have not been determined. Thus, no module-IDs have been described in the corresponding columns in the table of FIG. 7. Further, in cases where the transfer schedule is set in a manner like this example, the transfer arm to be used in the aforementioned arm group also has not been determined beforehand.

On the assumption that the wafer A1 is transferred according to this transfer schedule, the transfer schedule among modules in each block is determined by the control unit 3 during the transfer of the wafer A1 according to the status of transfer of other wafers W. The transfer arm to be used in the arm group for transferring the wafer A1 from the mount module TRS11 to one of the mount modules SCPL11-SCPL13 is determined by the control unit 3 based on the transfer status of other wafers W and the operating status of the first and second transfer arms 21 and 22.

Figure 8:
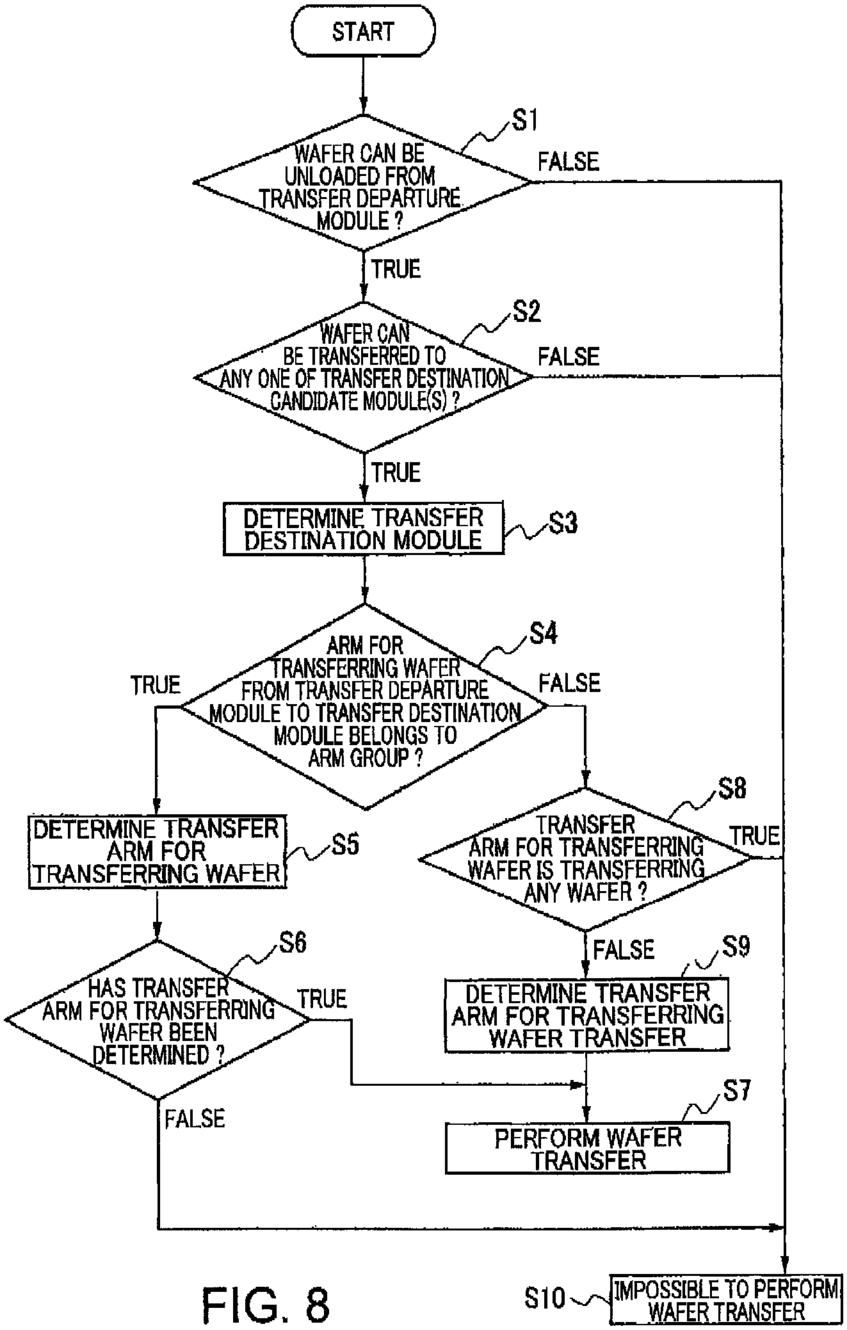
FIG. 8 is a flow chart showing a judgment process which is executed by a control unit of the coating and developing apparatus.

The following explanation will be made with reference to FIG. 8. FIG. 8 is a flow chart showing the control of the operation of the transfer arms by the control unit 3. This flow chart shows a procedure for determining whether or not to transfer a wafer W from a module of a certain type specified by one STEP in FIG. 5 to a module of another type specified by the next STEP in FIG. 5.

First, the control unit 3 judges whether or not the wafer W can be transferred (removed) from one module (transfer departure module) by use of the transfer arm(s) specified by the transfer route (step S1). If it is judged that the wafer W can be transferred (removed) from the transfer departure module, the control unit 3 then judges whether or not a module to which the wafer W can be transferred is included in the module(s), specified as the transfer destination module(s) (Le., transfer destination candidate module(s)) to which the wafer should be transferred by the specified transfer arm(s) from the transfer departure module (step S2). Specifically, if the transfer destination candidate module(s) is not a module included in a multiple module set but a single module, whether or not the wafer W can be transferred to the single module is judged. If the transfer destination candidate module (s) is a multiple module set, whether or not the wafer W can be transferred to any module included in the multiple module set is judged.

If it is judged in the step S2 that the transfer destination candidate module(s) include a module to which the wafer W can be transferred, the control unit 3 determines the module (to which the wafer W can be transferred) as a transfer destination module of the wafer W (step S3). In other words, the transfer schedule of the wafer W is determined, The way how to select one module, included in a multiple module set, as the transfer destination module in the steps S2 and S3 (in the case where the transfer destination candidate module(s) constitute a multiple module set) will be explained later.

After the determination of the transfer destination module, the control unit 3 judges whether or not the transfer arm(s) for transferring the wafer W from the transfer departure module to the transfer destination module constitute an arm group (step S4). If it is judged in the step S4 that the transfer arm(s) constitutes an arm group, the control unit 3 determines which transfer arm included in the arm group should perform the transfer of the wafer W (step S5). This step S5 will be explained in detail later.

Subsequently, the control unit 3 judges whether or not the transfer arm for performing the wafer transfer has been determined (step S6). If determined, the wafer W is transferred from the transfer departure module to the transfer destination module determined in the step S3 by use of the transfer arm thus determined (step S7). When the transfer of the wafer W is performed as explained above, the transfer departure module is the mount module TRS11, the transfer destination module is one of the mount modules SCPL11-SCPL13, and the wafer transfer is performed by the transfer arm thus selected from the first and second transfer arms 21 and 22, as explained with reference to FIGS. 5 and 6.

If it is judged in the step S4 that the transfer arm for transferring the wafer W from the transfer departure module to the transfer destination module does not constitute an arm group, the control unit 3 judges whether or not the transfer arm for transferring the wafer W, which wafer W is now transferable from the transfer departure module, is transferring another wafer W (step S8). If it is judged in the step S8 that the transfer arm is not transferring another wafer, the control unit 3 determines that the transfer of the wafer W from the transfer departure module to the transfer destination module should be performed by the transfer arm (step S9). Thereafter, the aforementioned step S7 is executed and the wafer W is transferred to the transfer destination module.

The transfer of the wafer W from the transfer departure module is not carried out (step S10):

if the step S1 judges that the wafer W cannot be removed from the transfer departure module (S1: False);

if the step S2 judges that a module to which the wafer W can be transferred does not exist (S2: False);

if the step S6 judges that the transfer arm for performing the wafer transfer has not been determined (S6: False); or if the step S8 judges that the transfer arm for transferring the wafer W (which is transferable from the transfer departure module) is transferring another wafer W (S8: True).

The determination of the transfer destination module and the determination of the transfer arm to be used in an arm group (in the case where the transfer destination module is a module to which the wafer W is transferred by an arm constituting an arm group) are made at substantially the same timing, since the series of the steps S1-510 are performed very quickly.

Figure 9:
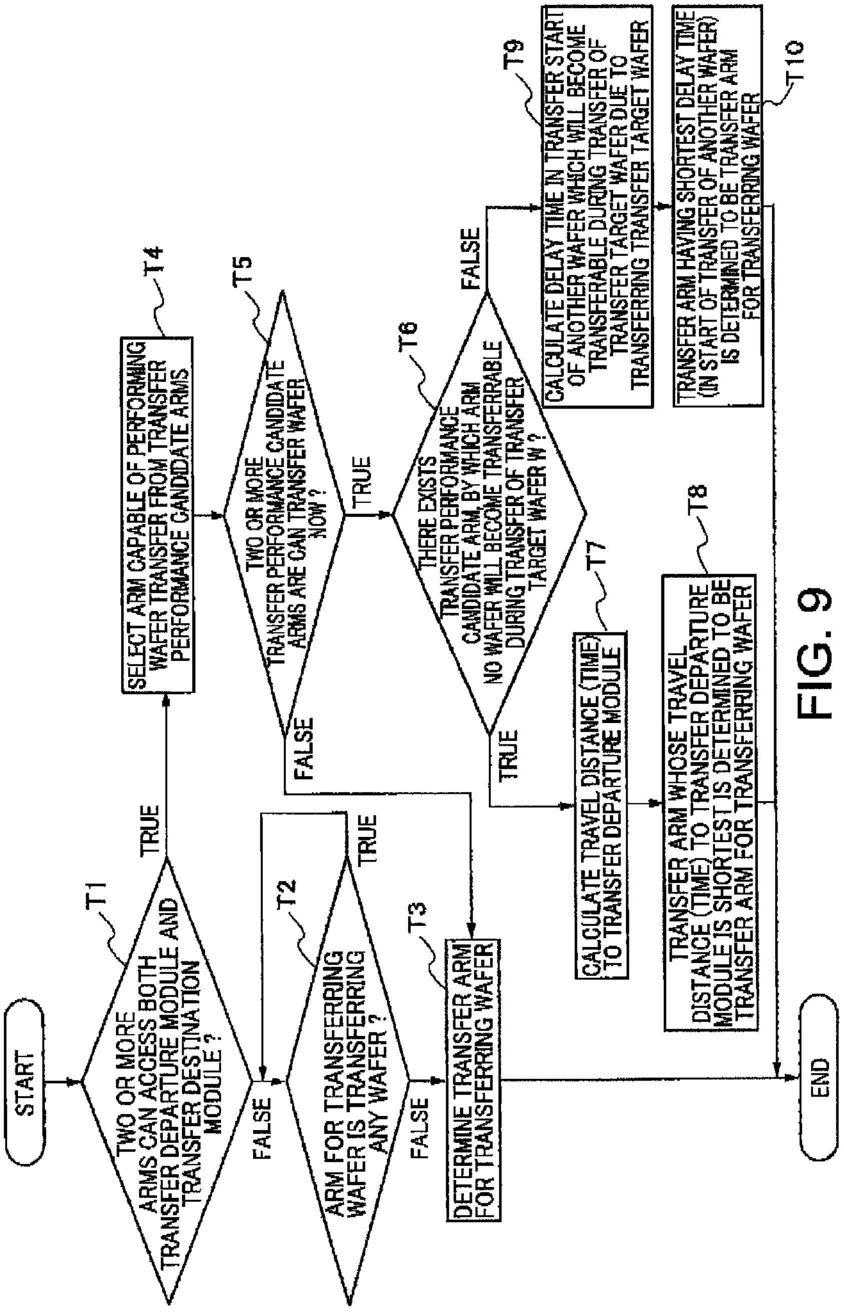
FIG. 9 is a flow chart showing a judgment process which is executed by the control unit of the coating and developing apparatus.

The step S4 for judging whether or not the transfer arm(s) for transferring the wafer W from the transfer departure module to the transfer destination module constitute an arm group and the step S5 for determining the transfer arm for performing the wafer transfer will be explained in detail below with reference to FIG. 9.

First, the control unit 3 judges whether two or more transfer arms capable of accessing both the transfer departure module (from which the wafer W has become transferable) and the transfer destination module(s) corresponding to the transfer departure module are provided (step T1). The step T1 is equivalent to the step S4, and thus the control unit 3 in the step T1 judges whether or not the transfer arm(s) for transferring the wafer W from the transfer departure module to the transfer destination module(s) constitutes an arm group.

If it is judged in the step T1 that two or more transfer arms capable of accessing both the transfer departure module and the transfer destination module are not provided, the control unit 3 judges whether or not the only one transfer arm capable of accessing the transfer departure module and the transfer destination module is transferring a wafer (step T2). If it is judged in the step 12 that the transfer arm is not transferring a wafer, the control unit 3 determines that the transfer of the wafer W from the transfer departure module to the transfer destination module should be performed by the transfer arm (step T3). If it is judged in the step T2 that the transfer arm is transferring a wafer, the step T2 is repeated as shown in the flow chart of FIG. 9.

If it is judged in the step T1 that two or more transfer arms capable of accessing both the transfer departure module and the transfer destination module are provided, the control unit 3 regards the two or more transfer arms as "transfer performance candidate arms" and detects (selects) an arm capable of performing the wafer transfer in (from) the transfer performance candidate arms (step T4). The arm capable of performing the wafer transfer means a transfer arm that is now in an idle state (i.e., in a stationary standby state without performing wafer transfer). If there is no arm capable of performing the wafer transfer, the step T4 is repeated until such an arm capable of performing the wafer transfer appears. Then, the control unit 3 judges whether or not the number of the detected transfer performance candidate arms capable of performing the wafer transfer is not less than 2 (step T5). If the number of the transfer performance candidate arms capable of performing the wafer transfer is less than two (i.e. one), the control unit 3 executes the aforementioned step T3, that is, determines that the transfer of the wafer W from the transfer departure module to the transfer destination module should be performed by the one transfer performance candidate arm capable of performing the wafer transfer.

The step T1 in the flow will be described in more detail below. In the coating and developing apparatus 1, the transfer route (data) specifies that, in a case where the transfer departure module for the wafer W is the mount module TRS11 and the transfer destination module is one of the mount modules SCPL11-SCPL13 as explained referring to FIGS. 5 and 6, the first and second transfer arms 21 and 22 can access these modules (TRS11 and SCPL11-SCPL13). Therefore, in a case where the wafer W can be transferred from another module other than the mount module TRS11 and the another module is the transfer departure module, the judgment result in step T1 is that the two or more transfer arms capable of accessing both the transfer departure module and the transfer destination module are "not" provided. If the wafer W can be transferred from the mount module TRS11 and the mount module TRS11 is the transfer departure module, the step T1 judges that two or more transfer arms capable of accessing both the transfer departure module and the transfer destination module (s) are provided.

The flow of the steps T4, T5 and T3 executed after the step T1 will be explained in detail below. In the step T4, the control unit 3 regards the first and second transfer arms 21 and 22 as the transfer performance candidate arms, and detects (selects) transfer-performable arm or arms (i.e., an arm or arms capable of transferring the wafer) among (from) the first and second transfer arms 21 and 22. Then, the control unit 3 judges whether both of the transfer arms 21 and 22 have been detected (selected) or only one of the transfer arms 21 and 22 has been detected (selected) (step T5). If only one of the transfer arms 21 and 22 has been detected, the control unit 3 determines that the wafer W should be transferred from the mount module TRS11 to one of the mount modules SCPL11-SCPL13 by use of the only one transfer arm (21 or 22) (step T3). If both of the transfer arms 21 and 22 have been detected, the control unit 3 executes step T6, which will be explained below.

In the case where it is judged that there are two or more transfer performance candidate arms capable of performing the wafer transfer in the step T5, the control unit 3 then judges, an the assumption that that the wafer W (transfer target wafer W) is transferred from the transfer departure module to the transfer destination module by each transfer performance candidate arm, whether or not there exists (among the two or more transfer performance candidate arms which are now capable of transferring the transfer target wafer W) one or more transfer performance candidate arm, by which arm no wafer (other than the transfer target wafer W) will become transferrable during the assumed transferring of the transfer target wafer W. In more detail, the control unit 3 performs the following judgment procedure. The control unit 3 select one of the transfer performance candidate arms which has been judged to be capable of performing the wafer transfer in the step T5. The control unit 3 assumes that the one transfer performance candidate arm immediately from now transfers the transfer target wafer W from the transfer departure module to the transfer destination module. Each transfer performance candidate arms (thus the one transfer performance candidate arm) is assigned to transferring of a wafer to or from two or more modules. Thus, it is possible that at least one wafer W placed in the modules will become transferable (removable) from these module(s) (e.g., due to the completion of the processing in the module) during the assumed transfer operation of the one transfer performance candidate arm. The control unit 3 judges whether or not there exists any wafer W which will become transferable from any module by the one transfer performance candidate arm during the assumed transfer operation of the one transfer performance candidate arm. The control unit 3 makes the same judgment in connection with each transfer performance candidate arm which has been judged to be capable of performing the wafer transfer in the step T5. If such a wafer (becoming transferrable) does not exist for at least one of the transfer performance candidate arms, the step T6 judges that there exists a transfer performance candidate arm meeting the judgment standard (T6: True), If such a wafer (becoming transferrable) exists for each transfer performance candidate arms, the step T6 judges that that there exists no transfer performance candidate arm meeting the judgment standard (T6: False).

If it is judged in the step 16 that there exists a transfer performance candidate arm meeting the judgment standard and if the number of such transfer performance candidate arms is two or more, the control unit 3 calculates the travel distance from the position in which each transfer arm is standing-by to the transfer departure module in regard to each of the transfer performance candidate arms (step T7). Then, the control unit 3 determines that the wafer transfer from the transfer departure module to the transfer destination module should be performed by the transfer performance candidate arm whose travel distance to the transfer departure module is the shortest (step T8). In the steps T7 and T8, the control unit 3 may calculate the travel time from the standby position (where each transfer performance candidate arm is in the standby state) to the transfer departure module (instead of the travel distance), and may determine that the wafer transfer should be performed by a transfer performance candidate arm whose travel time is the shortest. If the number of the transfer performance candidate arm meeting the judgment standard in the step T6 is only one, the control unit 3 determines that the wafer transfer from the transfer departure module to the transfer destination module should be performed by use of the one transfer performance candidate arm.

Figure 10:
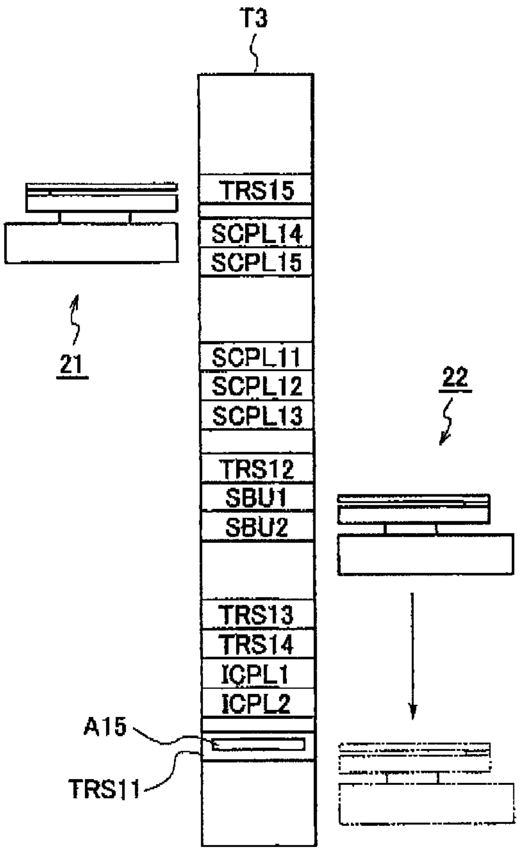
FIG. 10 is an explanatory drawing showing the operation of a transfer mechanism in the interface block.

The flow from the step 16 to the step T8 will be explained with reference to FIG. 10 showing one possible concrete example. It is assumed that: a wafer A15 has become transferable (removable) from the mount module TRS11 (transfer departure module); the first and second transfer arms 21 and 22 are not performing wafer transfer but are standing-by at the positions indicated by solid lines in FIG. 10; it has been judged in the step 15 that that there are two or more transfer performance candidate arms capable of performing the wafer transfer; and the mount module SCPL11 has been determined as the transfer destination module from the mount module TRS11.

Assuming that, from the aforementioned status, the first transfer arm 21 transfers the wafer A15 from the mount module TRS11 to the mount module SCPL11, the control unit 3 judges whether or not there exists another wafer W that will become transferable from the post-exposure cleaning module PIR1 or PIR2 (the first transfer arm 21 is assigned to the wafer transfer from the modules PIR1, PIR2) during the assumed transfer of the wafer A15. In addition, assuming also that the second transfer arm 22 transfers the wafer A15 from the mount module TRS11 to the mount module SCPL11, the control unit 3 also judges whether or not there exists another wafer W that will become transferable from the mount module TRS12, SBU1 or SBU2 or the back side cleaning module BST1 or BST2 (the second transfer arm 22 is assigned to the wafer transfer from the modules TRS12, SBU1, SBU2, BST1, BST2), during the assumed transfer of the wafer A15. Here, it is assumed that it is judged that such another wafer W does not exist in connection with the assumed transfer of the wafer A15 by both the first and second transfer arms 21 and 22 (step T6: True).

If such a judgment is made, the control unit 3 calculates the travel distance to the mount module TRS11 in regard to each of the first and second transfer arms 21 and 22 (step S7). As shown in FIG. 10, if the travel distance of second transfer arm 22 to the mount module TRS11 is the shorter, the control unit 3 determines that the transfer of the wafer A15 from the mount module TRS11 should be performed by the second transfer arm 22 (step T8), and as indicated by the chain lines in FIG. 10, the second transfer arm 22 moves toward the mount module TRS11 to receive therefrom the wafer A15.

Returning to the flow chart of FIG. 9, an explanation will be made for the case where it is judged in the step T6 that there exists no transfer performance candidate arm meeting the judgment standard (T6: False). Such a judgment is made where, irrespective of which transfer performance candidate arm is used for the transfer of the wafer W from the transfer departure module to the transfer destination module, there exists another wafer W that becomes transferable from a module other than the transfer departure module by the transfer performance candidate arm during the (assumed) transfer of the wafer W (transfer target wafer W).

In this case, in regard to each transfer performance candidate arm, the control unit 3 calculates a delay time in starting of the transfer of another wafer, which another wafer will become transferable during the transfer of the transfer target wafer W from the transfer departure module to the transfer destination module, which delay time is caused by performing the transfer of the transfer target wafer W from the transfer departure module to the transfer destination module (step T9). This delay time is defined as a time period (length of time) from the time point when said another wafer becomes transferable from a module to the time point when said another wafer W is actually removed (transferred) from the module by a transfer arm. That is, the delay time may be referred to a "waiting time" of said another wafer W in the module. The control unit 3 determines the transfer arm having the shortest delay time among the transfer performance candidate arms as the arm for transferring the wafer W from the transfer departure module to the transfer destination module (step T10). The steps T2 to T10 explained above correspond to the step S5 in the flow chart of FIG. 8.

The flow of the steps T6, T9 and T10 will be explained below in connection with a concrete example. In the example shown in FIG. 11, it is assumed that: the wafer A15 has been placed on the mount module TRS11 and has become transferable (removable) from the mount module TRS11, similarly to the example of FIG. 10; the first and second transfer arms 21 and 22 are in the standby state, and thus there are two or more transfer performance candidate arms (capable of performing the wafer transfer) in this state in the aforementioned step T5; and, like the example of FIG. 10, the wafer A15 has been determined to be transferred from the mount module TRS11 to the mount module SCPL11.

Figure 11:
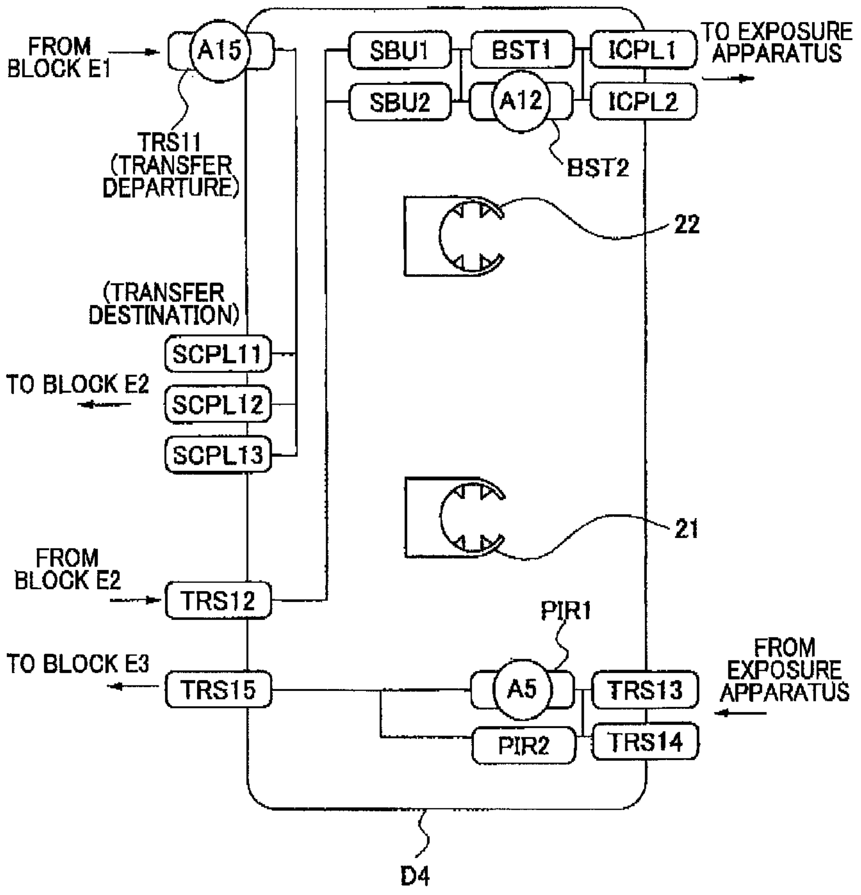
FIG. 11 is an explanatory drawing showing wafer transfer status in the interface block.

In the example of FIG. 11, however, unlike the example of FIG. 10, a wafer A12 has been transferred to the back side cleaning module BST2 and a wafer A5 has been transferred to the post exposure cleaning module PIR1. In this example, it is assumed that: during the assumed operation in which the wafer A15 is transferred to the mount module SCPL11 by use of the second transfer arm 22, the wafer A12 becomes transferable from the back side cleaning module BST2; and also during the assumed operation in which the wafer A15 is transferred to the mount module SCPL11 by use of the first transfer arm 21, the wafer A5 becomes transferable from the post exposure cleaning module PIR1. Thus, it is assumed that the step T6 have judged that there exists no transfer arm (transfer performance candidate arm) meeting the judgment standard of step T6.

Figure 12:
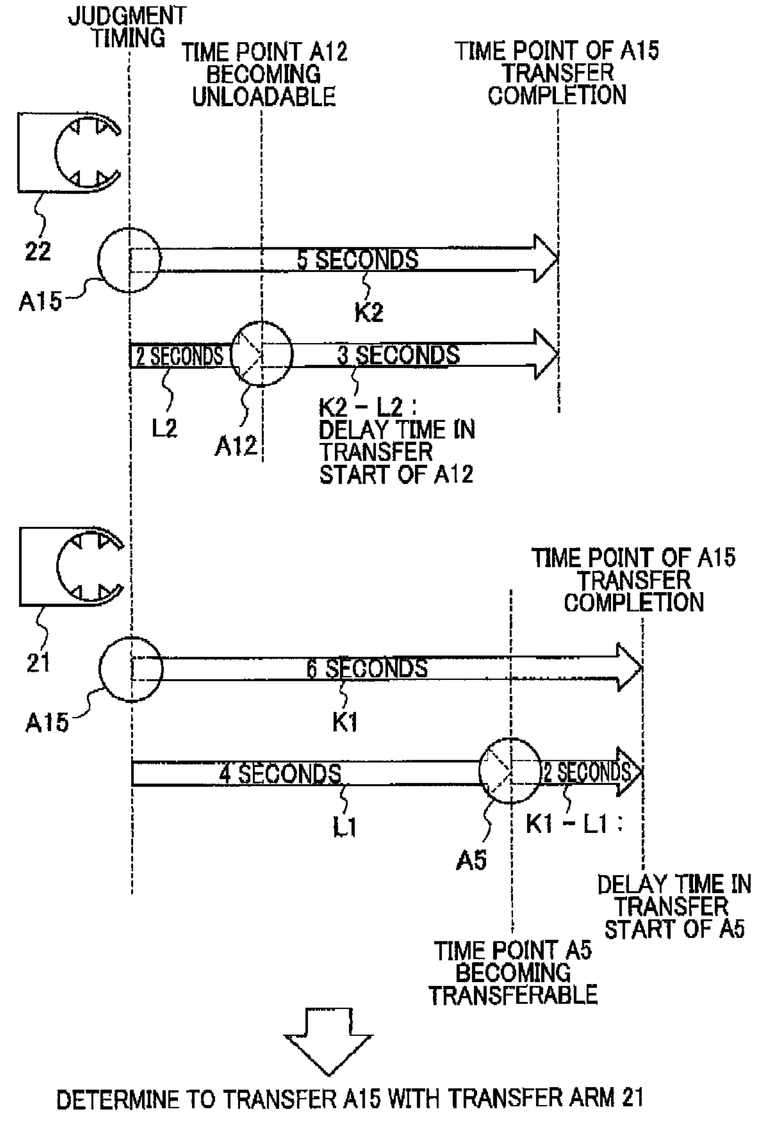
FIG. 12 is a schematic diagram for explaining transfer delay time in regard to wafers.

In this case, the aforementioned transfer delay time is calculated in regard to the wafers A5 and A12. A method for calculating the delay time will be explained below with reference to a schematic diagram of FIG. 12. First, the control unit 3 determines a time period (K1) necessary for transferring the wafer A15 to the mount module SCPL11 by use of the first transfer arm 21 and a time period (K2) necessary for transferring the wafer A15 to the mount module SCPL11 by use of the second transfer arm 22. In this example, it is assumed that K1 and K2 are 6 seconds and 5 seconds, respectively.

Subsequently, the control unit 3 determines a time period (L1) from the time point of calculation of the transfer delay time (i.e., from the time point when the wafer A15 became transferable from the mount module TRS11) to the point when the wafer A5 becomes transferable from the post exposure cleaning module PIR1, and also determines a time period (L2) from the time point of calculation of the transfer delay time to the time point when the wafer A12 becomes transferable from the back side cleaning module BST2. In this example, L1 and L2 are assumed to be 4 seconds and 2 seconds, respectively. Then, the control unit 3 calculates the delay time for the wafer A5 that is equivalent to the time period from the time point when the wafer A5 becomes transferable from the post exposure cleaning module PIR1 to the time point when the transfer of the wafer A5 is started (K1−L1=2 seconds). Likewise, the control unit 3 calculates the delay time for the wafer A12 that is equivalent to the time period from the time point when the wafer A12 becomes transferable from the back side cleaning module BST2 to the time point when the transfer of the wafer A12 is started (K2−L2=3 seconds) (step T9).

Then, the control unit 3 assigns the transfer arm having the shortest delay time to be used for transferring the wafer A15. In this example, the use of the first transfer arm 21 for the transfer of the wafer A15 makes the delay time the shortest, and thus the control unit 3 determines that the wafer A15 should be transferred from the mount module TRS11 to the mount module SCPL11 by use of the first transfer arm 21 (step T10).

The configuration of the interface block D4 will be explained in more detail below in order to facilitate understanding of the reason that the above determination of the transfer arm is made based on the transfer delay time. In the interface block D4, the mount modules are stacked up at multiple levels corresponding to the levels of the unit blocks E1-E3 of the processing block D3, so that the wafers W can be transferred between the interface block D4 and the unit blocks E1-E3 of the processing black D3. For the purpose of enabling wafer transfer among the mount modules and for the purpose of increasing the production efficiency of the device by arranging a lot of processing modules in the limited space inside the interface block D4, the first and second transfer arms 21 and 22 are arranged on the front and rear sides of the tower T3 of mount modules, and the stack of post exposure cleaning modules PIR and the stack of back side cleaning modules BST are arranged on the front and rear sides of the transfer arms 21 and 22 (to face each other across the transfer arms 21 and 22) as described above.

In such an arrangement of the modules and the transfer arms, both of the first and second transfer arms 21 and 22 can access the mount modules of the tower T3. However, increasing the productivity of the device becomes impossible if a deviation (difference) in the number of transfer processes occurs between the transfer arms 21 and 22 as explained in the background art. Thus, in regard to the mount modules that can be accessed by both of the transfer arms 21 and 22, it is preferable that the transfer arm 21 or 22 assigned to the wafer transfer between the mount modules can be changed flexibly depending on the current wafer transfer status, rather than fixing only one of the transfer arms 21 and 22 being assigned to the wafer transfer.

Further, even if the deviation in the number of transfer processes between the transfer arms 21 and 22 is suppressed, the productivity of the device cannot be increased sufficiently if the wafer W processed in each processing module is not quickly unloaded from the processing module (since the subsequent wafer W cannot be loaded into the processing module). For this reason, the determination of which of the transfer arms 21 and 22 should be used for the wafer transfer is made based on the transfer delay time as explained above so as to avoid long retention of the processed wafer W in each processing module. To sum up, the production efficiency of the device can be increased by the synergistic effect of the above-described layout of the modules and the transfer arms in the interface block D4 and the control of determining the arm to be used (the transfer arm 21 or 22) based on the transfer delay time. Incidentally, although the provision of a plurality of post exposure cleaning modules PIR in a stacked manner and a plurality of back side cleaning modules BST in a stacked manner as described above is effective, only one post exposure cleaning module PIR and only one back side cleaning modules BST may be provided.

Next, the determination of the transfer destination module in the steps S1 to S3 in FIG. 8 will be explained in detail. For each module in the interface block D4, the wafer transfer is performed as follows: when a wafer W has been transferred to a module (prior stage module), the transfer destination module corresponding to the next STEP is determined based on the aforementioned transfer route, so that the transfer schedule is set. Herebelow, an explanation will be made for a case where the modules for the next STEP constitute a multiple module set. It is assumed that a module number has previously been assigned to each module in the multiple module set.

When the steps S1 to S2 are performed to each wafer W transferred to the prior stage module, if no preceding wafer W exists in the multiple module set, the step S3 is performed to each wafer W so that the wafers W are sequentially transferred to the modules of the multiple module set cyclically, starting from the module having the smallest module number in the multiple module set. For example, in the transfer of the wafers A1-A5 from the mount module TRS11 to the mount modules SCPL1-SCPL3, assuming that the mount modules SCPL1-SCPL3 have therein no preceding wafer W at each time when each of the wafers A1-A5 becomes transferable from the mount module TRS11, the wafers A1-A5 are transferred cyclically to the multiple module set (mount modules SCPL1-SCPL3) in the order of SCPL1→SCPL2→SCPL3→SCPL1→SCPL2.

If the multiple module set has only one module having no preceding wafer W when the steps S1-S2 are executed, the determination of the transfer destination module for each wafer W is made in the step S3 so that each wafer W is transferred from the prior stage module to the module having no preceding wafer W. For example, in a case where the mount module SCPL11 has no preceding wafer W and the mount modules SCPL12 and SCPL13 have preceding wafers W in the multiple module set (mount modules SCPL11-

Figure 13:
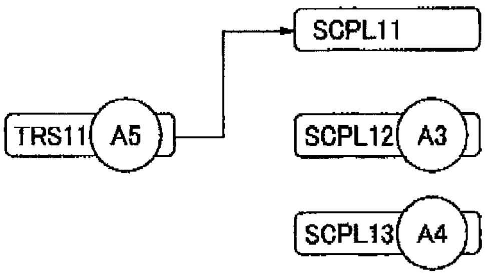
FIGS. 13 to 19 shows explanatory drawings for explaining a wafer transfer rule in a multiple module set.

SCPL13) when the wafer A5 is transferable from the mount module TRS11 as shown in FIG. 13, the transfer destination module is determined in the step S3 so that the wafer AS is transferred to the mount module SCPL11.

Figure 14:
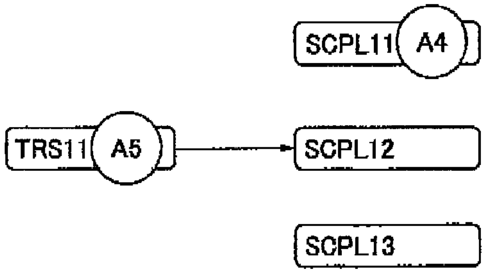

If the multiple module set has two or more modules having no preceding wafer W, the wafer W in the prior stage module is transferred to a module having the smallest module number among the modules having no preceding wafer W. In the example shown in FIG. 14, the mount module SCPL11 has a preceding wafer W (A4) and the mount modules SCPL12 and SCPL13 have no preceding wafer W, and thus the wafer A5 in the mount module TRS11 is determined to be transferred to the mount module SCPL12 having the smallest module number among the modules having no preceding wafer W.

Figure 15:
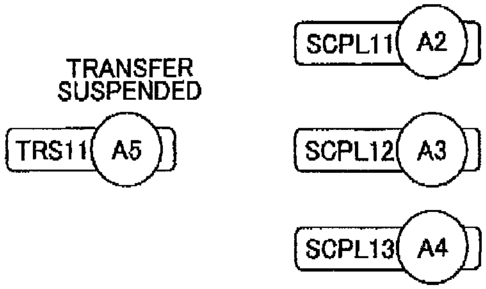
Figure 16:
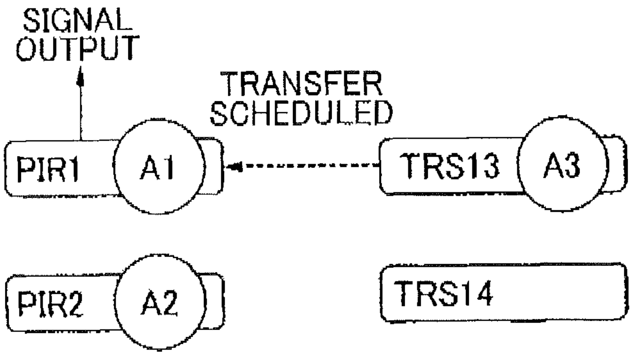

If all the modules of the multiple module set have a wafer W already transferred thereto and the wafer transfer to the multiple module set is thus impossible, the determination of the transfer destination module is not made according to the aforementioned steps S2 and S10, and the determination of the transfer destination module from the prior stage module is suspended until a module to which the wafer W in the prior stage module can be transferred (module capable of receiving the wafer W) appears in the multiple module set. FIG. 15 shows a specific example in which all the mount modules SCL11-SCPL13 of the multiple module set each have a wafer W already transferred thereto and the transfer of the wafer A5 in the mount module TRS11 is suspended. Incidentally, each processing module (for performing processing/treatment on a wafer W) outputs a prescribed signal soon before the time when the wafer W processed in the processing module becomes transferable (i.e,, removable or unloadable) from the processing module. Therefore, in a case where the processing modules belong to a multiple module set and all the modules of the multiple module set have a wafer W already transferred thereto, the determination of the transfer destination module is made based on the signal. In the example shown in FIG. 16, under the situation where both of the wafers A1 and A2 have been transferred to the post exposure cleaning modules PIR1 and PIR2 and are being subjected to the processing (post exposure cleaning) in the modules PIR1 and PIR2, a signal is outputted from the post exposure cleaning module PIR1, based on which the post exposure cleaning module PIR1 is determined to be the transfer destination module for the wafer A3 in the mount module TRS13. The wafer A3 is transferred to the post exposure cleaning module PIR1 after the wafer A1 is removed from the module PIR1.

Figure 17:
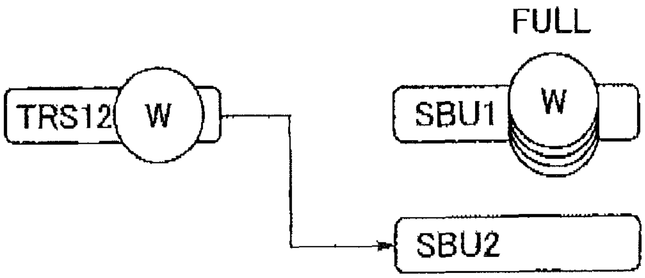
Figure 18:
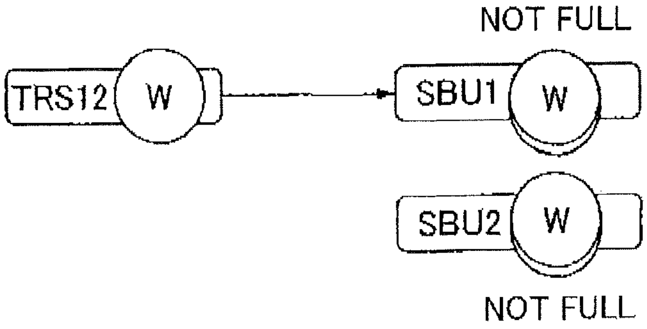
Figure 19:
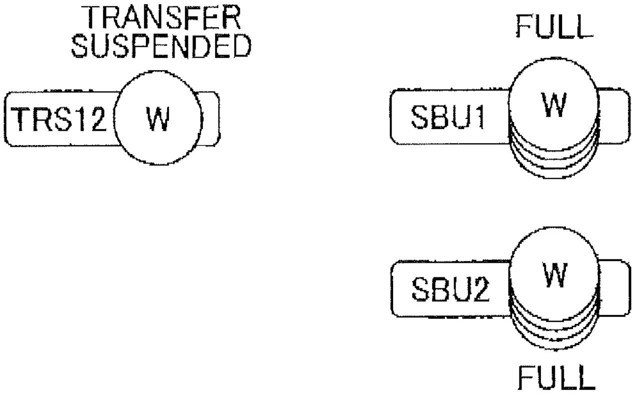

Next, an explanation will be made for a case where each of the modules constituting a multiple module as the transfer destination is configured to receive a plurality of wafers W (like the mount modules SBU). When only one mount module SBU can receive a wafer W and the other mount modules SBU cannot receive a wafer W, the one mount module SBU capable of receiving the wafer W is determined to be the transfer destination. In the example shown in FIG. 17, when a wafer W is transferred from the mount module TRS12, it is determined that the wafer W should be transferred to the mount module SBU2, since the mount module SBU1 is full of wafers W and thus cannot receive another wafer W. If the wafer can be transferred to two or more mount modules SBU, the mount module SBU having the smallest module number is determined to be the transfer destination, In one example shown in FIG. 18, since both of the mount modules SBU1 and SBU2 can receive a wafer W, it is determined that the wafer W in the mount module TRS12 should be transferred to the mount module SBU1 having the smallest module number. When the wafer transfer is possible to none of the mount modules SBU, the determination of the transfer destination from the prior stage module is suspended. In one example shown in FIG. 19, both of the mount modules SBU1 and SBU2 are full of wafers W, and thus the wafer transfer from the mount module TRS12 is suspended.

The setting of the transfer schedule in the other blocks will be explained below briefly. In the carrier block D1 and the multipurpose block D2, the transfer schedule is set according to the same rules as those in the interface block D4. In regard to each unit block E1-E3 in the processing block D3, when a wafer W becomes transferable from a mount module disposed at the entrance of the unit block E, the transfer schedule of the wafer W in the unit block E is set by determining the transfer destination module from the modules in the unit block E to be accessed by the transfer arm F. In the unit block E1, for example, when a wafer W has become transferable from one of the mount modules SCPL1-SCPL3, the transfer destination module is determined successively according to the aforementioned steps S1-S3 of FIG. 8, so that the wafer W will be transferred to one of the resist coating modules COT, to one of the heating modules PAB, and to the mount module TRS11 as the exit of the unit block E1. In a case where the transfer destination module is determined from a multiple module set, such a determination is made so that the processing of the wafer(s) W in the unit block E1 is finished the earliest. In this way, the transfer schedule of a wafer W is set successively during the transfer of the wafer W in each block.

In the foregoing embodiment, each time when a wafer W should be transferred from the mount module TRS11 which can be accessed by both the first and second transfer arms 21 and 22, it is determined that the transfer arm 21 or 22 is to be used for the wafer transfer based on the status of use of the transfer arms 21 and 22. This makes it possible to suppress the deviation in the number of transfer processes between the first and second transfer arms 21 and 22 compared to the case where one of the transfer arms 21 and 22 is previously determined as the arm to be used for the wafer transfer from the mount module TRS11 and the use of the determined transfer arm 21 or 22 is continued. Further, the determination is made so as to reduce the delay time in the transfer of a wafer W from a module that can be accessed by the transfer arms 21 and 22. Consequently, the production efficiency of the coating and developing apparatus 1 can be increased.

Further, in the foregoing embodiment, when a wafer W has become transferable from the mount module TRS11, if it is judged that there will be no other wafer to be transferred by the first or second transfer arm 21, 22 during the transfer of the wafer W by the first or second transfer arm 21, 22, the transfer arm for transferring the wafer W is determined based on the positions of the first and second transfer arms 21 and 22. This makes it possible to transfer the wafer W from the mount module TRS11 by use of the transfer arm capable of accessing the mount module TRS11 the earliest. Therefore, the productivity of the coating and developing apparatus 1 can be increased more reliably while reducing the number of transfer processes.

Furthermore, in the foregoing embodiment, the wafer transfer schedule is set for each wafer W, by determining a transfer destination module from each multiple module set during transferring of the wafer W. Thus, a major change of the transfer schedule can be avoided, even when one of the modules constituting the multiple module set becomes unusable, for example. Such a major change could be necessary in a case where a transfer schedule specifying all the modules corresponding to all the STEPs defined by the transfer route is set for every wafer W before transferring from the carrier C. Such a major change of the transfer schedule needs long time for resetting the transfer schedule and renders the wafer transfer impossible during the resetting of the transfer schedule. The foregoing embodiment prevents such transfer interruptions of wafers W, and thus throughput of the coating and developing apparatus 1 can be improved.

In the forgoing embodiment, the wafer transfer from the mount module TRS12 to the mount modules SBU1-SBU2 may also be performed by any one of transfer arms constituting an arm group, and the transfer arm may also be determined in the manner that has been explained with reference to the flow chart of FIG. 9, for example. Although the wafer transfer using a plurality of arms constituting an arm group is performed in the interface block in the above embodiment, the coating and developing apparatus may also be configured such that the wafer transfer using a plurality of arms constituting an arm group is also performed in the multipurpose block D2, for example.

In detail, a transfer arm (front side arm) similar to the transfer arm 14 may be disposed on the front side of the tower T1, and a tower including a stack of processing modules may be disposed on the front side of the front side arm. The processing modules in the stack include hydrophobizing modules ADH (similarly to the modules arranged on the front side of the multipurpose block D2), for example, and can be accessed by the front side arm. The front side arm and the transfer arm 14 constitute an arm group. This arm group is used for the wafer transfer from the mount module TRS2 to the mount module TRS3 shown in FIG. 6. The wafer transfer from the hydrophobizing modules ADH to the mount modules SCPL1-SCPL3 are performed by the transfer arm 14 and the front side arm which are assigned for the wafer transfer between these modules.

It should be noted that the module called "processing module" in the foregoing description may be an inspection module for inspecting wafers W.

The invention claimed is:

1. A coating and developing apparatus that forms, in a processing block, a coating film including a resist film on a substrate removed from a carrier loaded into a carrier block, and performs, in the processing block, a developing process to the substrate having been exposed by an exposure apparatus connected to an interface block, said coating and developing apparatus comprising:

a first mount module on which the substrate is placed;

a second mount module on which the substrate transferred from the first mount module is placed;

first and second transfer mechanisms each of which is provided to transfer the substrate from the first mount module to the second mount module, wherein one of the first and second transfer mechanisms is selected each time when the substrate is to be transferred from the first mount module to the second mount module;

first and second processing modules which are each configured to process the substrate, wherein the first transfer mechanism and the second transfer mechanism are assigned to transfer the substrate to the first processing module and the second processing module, respectively; and a control unit that selects one transfer mechanism, which is to be used for transferring the substrate from the first mount module to the second mount module, from the first and second transfer mechanisms and outputs a control signal that instructs the selected transfer mechanism to transfer the substrate;

wherein the control unit is configured to determine a first delay time in removing the substrate from the first processing module by the first transfer mechanism which first delay time is caused due to transferring of the substrate to the second mount module by the first transfer mechanism, and also determine a second delay time in removing the substrate from the second processing module by the second transfer mechanism which second delay time is caused due to transferring of the substrate to the second mount module by the second transfer mechanism, and configured to select the first transfer mechanism as said one transfer mechanism if the first delay is shorter than the second delay, or the second transfer mechanism as said one transfer mechanism if the second delay is shorter than the first delay.

2. The coating and developing apparatus according to claim 1, wherein the control unit is configured to select one of the first and second transfer mechanisms, as said one transfer mechanism, which is capable of removing the substrate from the first mount module earlier, if it is determined that any delay in removing the substrate from the first processing module by the first transfer mechanism caused due to the transferring of the substrate to the second mount module by the first transfer mechanism does not occur and that that any delay in removing the substrate from the second processing module by the second transfer mechanism caused due to the transferring of the substrate to the second mount module by the second transfer mechanism does not occur.

3. The coating and developing apparatus according to claim 1, wherein the first and second mount modules are arranged vertically, and the first and second transfer mechanisms are arranged on both sides of an arrangement of the first and second mount modules with the arrangement of the first and second mount modules being positioned between the first and second transfer mechanisms.

4. The coating and developing apparatus according to claim 1, wherein:

the processing block includes a stack of a plurality of unit blocks, containing a first unit block and a second unit block, which stack is formed by vertically stacking the plurality of unit blocks;

each of the unit blocks includes; a plurality of processing modules each for forming the coating film on the substrate before exposure, or for performing the developing process on the substrate after exposure; and a transferring mechanism that moves along a linear transfer path extending from the carrier block side of the unit block to a side far from the carrier block side to transfer the substrate among the processing modules; and the first and second mount modules are arranged vertically so as to correspond to the corresponding to the first and second unit blocks, respectively.

5. The coating and developing apparatus according to claim 1, wherein:

the first processing module is arranged in a first stack of a plurality of processing modules, which is formed by vertically stacking the plurality of processing modules, and the second processing module is arranged in a second stack of a plurality of processing modules, which is formed by vertically stacking the plurality of processing modules and is different from the first stack.

6. The coating and developing apparatus according to claim 1, wherein the first and second mount modules, the first and second processing modules, and the first and second transfer mechanisms are arranged between the processing block and the exposure apparatus.

7. A method of operating a coating and developing apparatus, the apparatus being configured to form a coating film including a resist film on a substrate removed from a carrier, and configured to perform a developing process to the substrate having been exposed by an exposure apparatus connected to an interface block, said method comprising:

transferring, after a substrate is placed on a first mount module, the substrate to a second mount module by use of a first transfer mechanism, and thereafter removing a substrate from a processing module by use of the first transfer mechanism;

transferring, after a substrate is placed on the first mount module, the substrate to a second mount module by use of a second transfer mechanism, and thereafter removing a substrate from a second processing module by use of the second transfer mechanism; and selecting, after a substrate is placed on the first mount module, one transfer mechanism from the first and second transfer mechanisms which is to be used for transferring the substrate to the second mount module, wherein the selecting of said one transfer mechanism includes:

determining a first delay time in removing the substrate from the first processing module by the first transfer mechanism which first delay time is caused due to the transferring of the substrate to the second mount module by the first transfer mechanism, and also determining a second delay time in removing the substrate from the second processing module by the second transfer mechanism which second delay time is caused due to the transferring of the substrate to the second mount module by the second transfer mechanism; and selecting the first transfer mechanism as said one transfer mechanism if the first delay is shorter than the second delay, or the second transfer mechanism as said one transfer mechanism if the second delay is shorter than the first delay.

8. The method according to claim 7, wherein the selecting of said one transfer mechanism includes:

selecting one of the first and second transfer mechanisms, as said one transfer mechanism, which is capable of removing the substrate from the first mount module earlier, if it is determined that any delay in removing the substrate from the first processing module by the first transfer mechanism caused due to the transferring of the substrate to the second mount module by the first transfer mechanism does not occur and that that any delay in removing the substrate from the second processing module by the second transfer mechanism caused due to the transferring of the substrate to the second mount module by the second transfer mechanism does not occur.

9. A non-transitory storage medium storing a computer program to be used for a coating and developing apparatus, wherein the computer program causes the coating and developing apparatus to execute the steps according to claim 7.

* * * * *